United States Patent [19]

Dinh

[11] 4,293,820

[45] Oct. 6, 1981

[54] POSITIVE FEEDBACK BIQUAD FILTER

[75] Inventor: Chon T. L. Dinh, Brossard, Canada

[73] Assignee: Centre de Recherche Industrielle du Quebec, Pointe-Claire, Canada

[21] Appl. No.: 69,092

[22] Filed: Aug. 23, 1979

[51] Int. Cl.³ .............................................. H03F 1/34
[52] U.S. Cl. ..................................... 330/85; 330/109; 330/112
[58] Field of Search ................. 330/107, 109, 294, 85, 330/112

[56] References Cited

FOREIGN PATENT DOCUMENTS 1383204  2/1975  United Kingdom ................ 330/107

*Primary Examiner*—James B. Mullins
*Attorney, Agent, or Firm*—Alan Swabey; Robert Mitchell; Guy J. Houle

[57] ABSTRACT

A positive feedback RC active biquadratic filter circuit comprising a passive input RC section and an active amplification output section having at least one operational amplifier. The RC section has two true resistive T-networks and a true capacitive T-network connected to receive an input signal. The RC section realizes a second order function with a low Q factor. The operational amplifier has a feedback resistive connection from an output thereof to a mid-junction point between each of three capacitances in the capacitive T-network. The capacitive T-network and one of the two resistive T-networks are connected to a positive input of the operational amplifier. The other resistive T-network is connected to a negative input of the operational amplifier.

22 Claims, 4 Drawing Figures

POSITIVE FEEDBACK BIQUAD FILTER

BACKGROUND OF INVENTION (a) Field of the Invention

The present invention relates to a positive feedback RC active biquadratic filter circuit.

(b) Description of Prior Art

In the design of active filters, it is often desirable to construct a filter in common sections which can easily be manufactured in series. These sections are often referred to as sub-networks and they are required to be sufficiently versatile whereby filter circuits may be constructed using the individual sections whereby to obtain a large spectrum of desired filter characteristics. Generally, these sub-networks are of the second order and connected in cascade or otherwise. These sections render a transfer function of the biquadratic type and which can be expressed mathematically, as is well known, by the equation:

$$T(s) = \frac{n_2 s^2 + n_1 s + n_o}{s^2 + d_1 s + d_o}$$

A large number of circuit configurations are known in the art, such as gyrator, generalized immittance converter, biquad-loop, single amplifier biquad, which circuit configurations can realize the transfer function mathematically expressed above. By comparing the calculations of the sensitivity of such sub-networks, it is seen that the single amplifier biquad sub-network will give a better performance. A popular one of such single amplifier biquad is that described in U.S. Pat. No. 3,919,658 issued on Nov. 11, 1975 to J. J. Friend and assigned to Bell Telephone Laboratories Incorporated. This patent describes a biquad filter using a single operational amplifier with negative feedback. Reference is also made to an article by G. Wilson et al entitled "RC-Active Networks with Reduced Sensitivity to Amplifier Gain-Bandwidth Product", IEEE Trans-on Circuits Syst, vol. CAS-21, No. 5, Sept. 1974, pp. 618–626. This article deals with single amplifier biquad networks and suggests band-pass or band-stop resonator applications. Reference is also made to an article by P. E. Fleisher, entitled "Sensitivity Minimization in a Single Amplifier Biquad Circuit", IEEE Trans. Circuits Syst., vol. CAS-23, Jan. 1976, pp. 45–55. In this article, Fleisher deals with the single amplifier biquad of Friend for a band-pass application. For configurations in applications of Low-Pass Notch, and High-Pass Notch, it is noted that the poles and the zeros cannot be too far apart in order to maintain approximately the same optimal topology that is obtained with band-pass resonators. However, when we realize an elliptical low-pass filter at high frequency, the disadvantages become more pronounced.

Another factor to be considered, is that in the technology of silicium, seeing that the thermal coefficient of the elements used in the active operational amplifiers is relatively large (of the order of a few thousand ppm/°C.), the active RC filter must be of a quality which is insensitive to the product of "gain-bandwidth" in the operational amplifier utilized. Consequently, the active RC filters are of the low frequency type. The present state of the art is that the operational amplifier utilized 0.1 to 0.2% of the gain-bandwith and this is for the good configurations of active RC filters realized with operational amplifiers with internal compensation (first order).

SUMMARY OF INVENTION

It is a feature of the present invention to provide a positive feedback RC active biquadratic filter which is an advancement in the art described hereinabove.

A further feature of the present invention is to provide a positive feedback RC active biquadratic filter circuit which has an improved active sensitivity as compared to the filters heretofore known. The active sensitivity is independent of Q and inversely proportional to the power i of the gain of the operational amplifier, with $i \geq 1$. Thus, there is possible the utilization of the filter at high frequency at about 2–3% of the bandwidth of the operational amplifier.

A further feature of the present invention is to provide a positive feedback RC active biquadratic filter circuit wherein the sum of the absolute value of the sensitivities of the resonant frequency with relation to the passive components, is minimum and is equal to 2. The Q sensitivity of the resonant factor is therefor proportional to Q. At low frequencies, because the active sensitivity is extremely weak, it can be partially sacrificed to reduce the Q sensitivity. Therefore, the values of the resistances may be reduced by utilizing a T transformation network. This possibility then becomes an advantage with relation to the tolerance of the components.

A further feature of the present invention is to provide a positive feedback RC active biquadratic filter circuit which utilizes a passive network utilizing three capacitances having a relationship to obtain the given transfer function. Because capacitors cannot be tuned in a hybrid arrangement, this may become a disadvantage when we want to utilize a single mask in order to realize all transfer functions. This disadvantage is, however, overcome by utilizing a buffer at the input or output of the section and fixing the three capacitors. Because the cost of the operational amplifier can be diminished by a great extent, this technique may be used for fabricating such filters in series. The buffer thus provides a means to obtain the summation which is necessary for multiple-loop feedback topologies.

According to the above features, from a broad aspect, the present invention provides a positive feedback RC active biquadratic filter circuit. The filter circuit comprises a passive input RC section and an active amplification output section having at least one operational amplifier. The RC section has two true resistive T-networks and a true capacitive T-network connected to receive an input signal. The RC section realizes a second order function with a low Q factor. The operational amplifier has a feedback resistive connection from an output thereof to a mid-junction point between each of three capacitances in the capacitive T-network. The capacitive T-network and one of the two resistive T-networks are connected to a positive input of the operational amplifier. The other resistive T-network is connected to a negative input of the operational amplifier.

According to a further broad aspect of the present invention there is provided a positive feedback RC filter circuit comprising a passive input RC section, and an active amplification output section having at least one operational amplifier. The RC section has two true resistive T-networks and a true capacitive T-network and a single resistive feedback connection to realize a true second order function.

BRIEF DESCRIPTION OF DRAWINGS

A preferred embodiment of the present invention will now be described with reference to the drawings in which.

DESCRIPTION OF PREFERRED EMBODIMENTS

Figure 1:
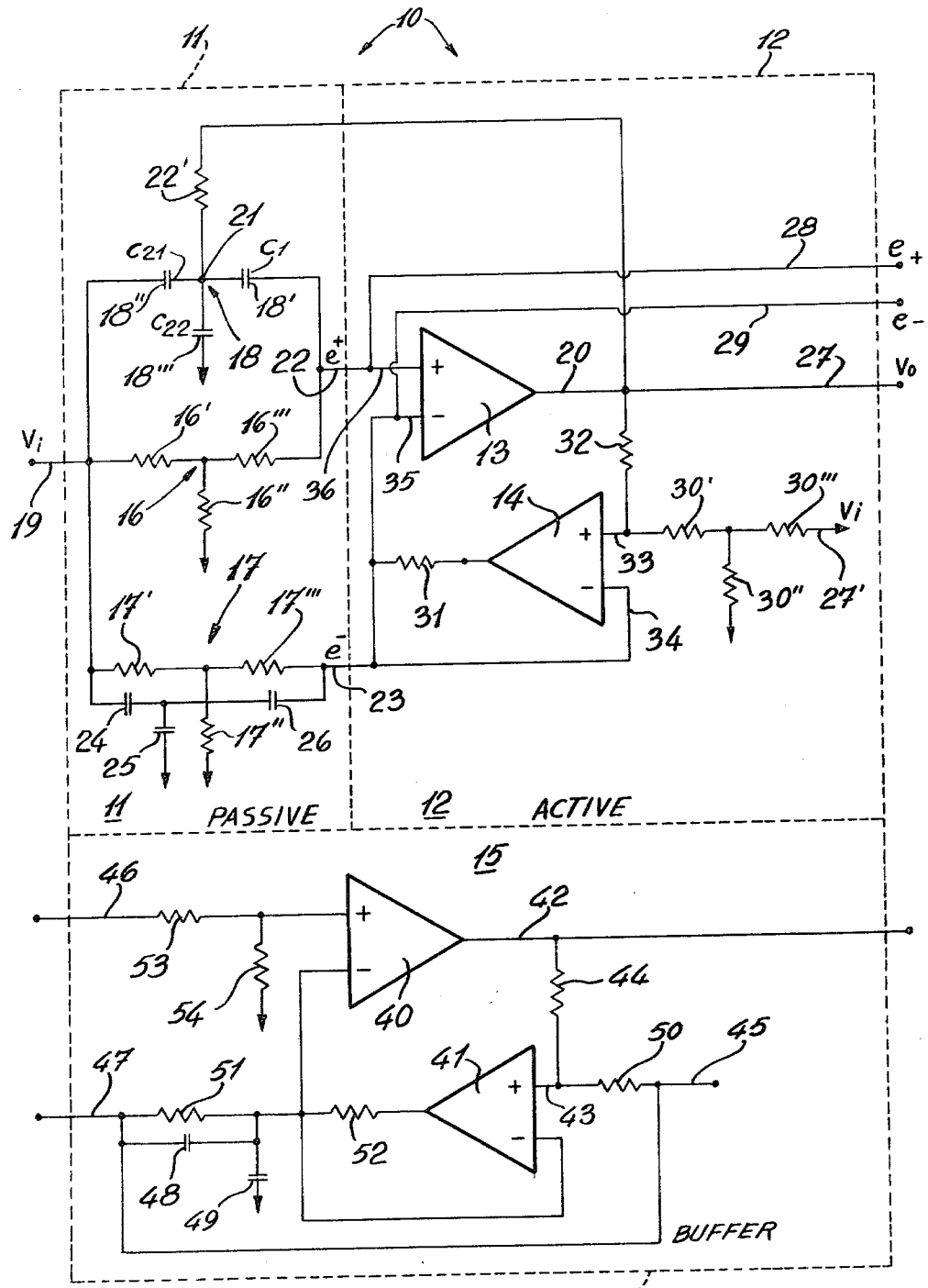
FIG. 1 is a schematic diagram of the filter circuit showing the passive, active and buffer sections.

Referring now to the drawings, and more particularly to FIG. 1, there is shown generally at 10, the two sections which form the positive feedback RC active biquadratic filter circuit of the present invention. The first section 11 is a passive input section and the second section 12 is the active amplification output section which comprises in this embodiment two biquadratic operational amplifiers 13 and 14. The section 15 is a buffer section which is optional to the construction of the filter circuit 10.

The passive section 11 is composed of two true resistive T-networks 16 and 17 and a true capacitive T-network 18. An input 19 connects an input signal to a common branch of the three true T-networks 16, 17 and 18. A feedback connection 20 connects to a mid-point 21 of the capacitive T-network 18 through a feedback resistance 22. The feedback connection is from the output 20 of the operational amplifier 13. The passive section 11 also has two output connections e+ and e−, respectively at 22 and 23. The principal components of the passive section are capacitances 18', 18" and 18''', and resistances 22', 16', 16", 17' and 17". The two resistances 16''' and 17''' are utilized when the values of resistances 16' and 16" and 17, 17" require to be respectively excessive. Normally, the resistances 16''' and 17''' are short-circuited. The topology of the filter remains unchanged when the values of these two resistances are not zero. The three capacitances 24, 25 and 26 are utilized for passive compensation when the filter operates at high frequency.

Referring now to the active filter section 12, it has two inputs connecting to the outputs 22 and 23 of the passive filter section and one auxiliary input 27' which receives the input signal as on the input 19 of the passive section. The outputs of the active filter section 12 are constituted by a feedback connection 27 and the e+ and e− connections 28 and 29. The resistances 30', 30" and 30''' are equal respectively to the resistances 17', 17" and 17''' of the true T-network in the passive section. The resistances 31 and 32 are equal when the two operational amplifiers 13 and 14 are identical. The interconnection of the two operational amplifiers which are of the internal first order compensation type and having the same thermal coefficient, permits to utilize the filter at high frequencies and to obtain a thermal compensation.

As shown, the output 20 of the first operational amplifier 13 connects to the positive input 33 of the second operational amplifier 14. This input 33 receives the input signal from input connection 27 which is the same signal as on the input 19 of the passive circuit. The negative input 34 of the second operational amplifier 14 connects to the negative input 35 of the first operational amplifier 13 and to the output connection 23 of the passive section 11. The output 22 of the passive section 11 connects to the positive input 36 of the first operational amplifier 13. The output connections 28 and 29 also connect to the positive and input terminals 36 and 35 respectively of the first amplifier 13. The feedback load connection of these two operational amplifiers provide for high frequency compensation and thermal compensation.

As above described, the buffer circuit 15 is optional and may be connected to the positive or negative input connections 28 and 29 of the first operational amplifier 13 or its output connection 27. By connecting the buffer circuit 15 to the input connections, we realize a band-pass or low-pass filter stage. With the connection being to the output, we realize a high-pass, band-stop or low-pass notch or high-pass notch filter stage.

The buffer circuit 15 also comprises two operational amplifiers 40 and 41 connected in a feedback mode as is the case in the active filter section 12. Thus, the output 42 of the first operational amplifier 40 is connected to a positive input 43 of the second operational amplifier 41 through resistance 44. An input 45 connects to the positive input 43 of the second operational amplifier and it may be connected to the output 27 of the active filter section or ground, depending on the desired configuration of the circuit. The two inputs 46 and 47 are connectable respectively to the outputs 28 and 29 of the active filter section. The capacitances 48 and 49 are for passive compensation. The resistances 50 and 44 are equal to the resistances 51 and 52, respectively. Resistances 53 and 54 constitute a voltage divider for the input voltage signal.

Figure 2:
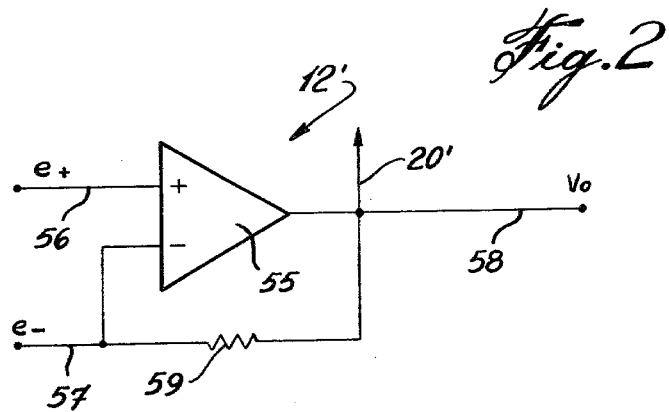
FIG. 2 is a schematic diagram of a further embodiment of the active section of the filter.

Referring now to FIG. 2, there is shown a further embodiment 12' of the active filter section 12. As hereinshown, the active filter utilizes a single operational amplifier 55. It is the most economical configuration when the filter is required to work around 0.2% of the band-width of the operational amplifier. The amplifier circuit consists essentially of inputs 56 and 57 for connection to the e+ and e−, respectively and an output connection 58 equivalent to output connection 27 in FIG. 1. The resistance 59 is for the gain and feedback of the amplifier 55.

Figure 3:
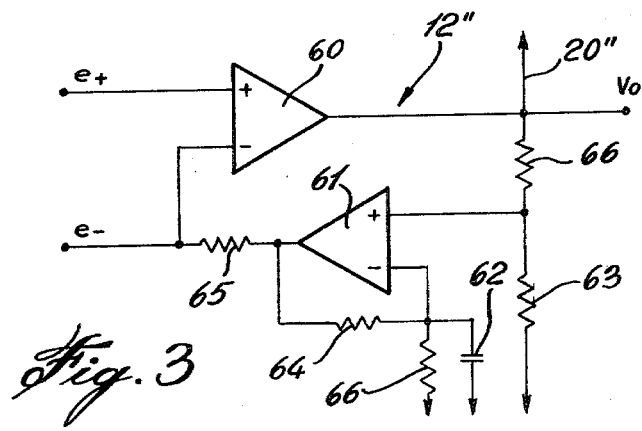
FIG. 3 is a schematic diagram of a still further embodiment of the active filter section.

Referring now to FIG. 3, there is shown a still further embodiment 12" of the active filter circuit 12. In this embodiment, two operational amplifiers 60 and 61 are used and connected in a feedback mode. This operational amplifier gives a performance similar to that of the active filter design shown in FIG. 1. The capacitance 62 is provided to realize the high frequency compensation of the circuit. Resistances 63 and 64 set the gain of the amplifiers and resistances 65 and 66 are feedback resistances.

Figure 4:
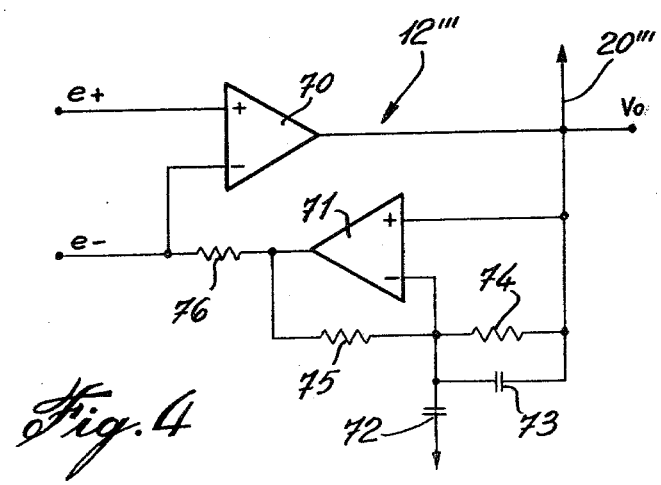
FIG. 4 is a schematic diagram of a still further embodiment of the active filter section.

FIG. 4 illustrates a still further embodiment 12''' of the active filter section. It also utilizes two operational amplifiers 70 and 71 connected in a feedback mode. As hereinshown, two capacitors 72 and 73 are connected in the circuit to realize the high frequency compensation and resistances 74, 75 and 76 are for feedback and to set the gain of the amplifiers.

All three embodiments shown in FIGS. 2, 3 and 4 have a feedback connection 20', 20" and 20''' respectively to connect to the mid-point junction of the true capactive T-network in the passive section 11.

A mathematical description of the positive feedback RC active circuit 10 shown in FIG. 1 now follows. To simply the mathematical expressions, we will assume that R16''' is equal to R17''' and equal to zero and that the capacitance 26 equals zero. Also, the analysis of the three embodiments 12', 12'' and 12''' of the active filter section 12' can be done in a similar manner and it is therefor not necessary to give individual results herein.

For the active section 12', the relationship between $v_i$ (input signal at connection 19), $e+$ (input signal at 22 or 36 of operational amplifier 13) and $v_o$ (signal at the feedback connection 27 or the output 21 of the first operational amplifier 13) can be written as follows:

$$e_+ = \rho_a I_i v_i + \frac{1}{\mu} I_o v_o \quad (1)$$

where
$\rho_a = G_a'/G_t'$
$1/\mu = G_b'/G_t'$
$G_t' = G_a' + G_b' + G_c'$
$G_a'$, $G_b'$, $G_c'$ are respectively the conductance of the resistors 30''', 32, 30''. $G_a$, $G_b$, $G_c$ are respectively the conductance of 17', 31, 17''.

In the equation (1), $I_o$ can be written as:

$$I_o = \frac{1 + \tau_o s + \tau_o \tau_1 s^2 + \tau_o \tau_1 \tau_t s^3}{1 + \tau_1 s + \tau_1 \tau_t s^2} \quad (2)$$

where
$\tau_o = \frac{G_t'}{G_b'} \cdot \frac{1}{B_o}$, $\tau_1 = \frac{G_t}{G_b} \cdot \frac{1}{B_1}$ et $\tau_t = (C_a + C_c)/G_t$ and $C_a$, $C_c$ are respectively the capacitors 24, 25.

$B_o$ and $B_1$ are the bandwidths of the operational amplifiers 13 and 14, respectively.

In the equation (2), the condition of the design for double active and passive compensation can be expressed by:

$$\tau_0 = \tau_1 = \tau_t = \tau \quad (3)$$

and $I_o$ becomes $$I_o = \frac{1 + \tau s + \tau^2 s^2 + \tau^3 s^3}{1 + \tau s + \tau^2 s^2} \cong 1 + \tau^3 s^3 \quad (3)$$

In order to keep this double compensation in a large temperature range, the equation (3) demonstrates that the thermal coefficient $\tau_t$ must be equal to that of $\tau_o$ or $\tau_1$.

On the other hand, if we wish only the active compensation, i.e. $\tau_o = \tau_1 = \tau$ and $\tau_t = 0$, then $I_o$ is written:

$$I_o = \frac{1 + \tau s + \tau^2 s^2}{1 + \tau_o} \cong 1 + \tau^2 s^2$$

The table set forth hereinbelow summarizes the values of $I_o$ for the four embodiments of the active filter section.

TABLE 1

| Active Filter | Approximate value of $I_o$ | Comments |
|---|---|---|
| No. 12(FIG. 1) | $I_o = 1 + \tau^2 S^2$ | Active Compensation |
|  | $I_o = 1 + \tau^3 S^3$ | A + P Compensation |
| No. 12'(FIG. 2) | $I_o = 1 + \tau S$ | No Compensation |
|  | $I_o = 1 + \tau^2 S^2$ | Passive Compensation |
| No. 12''(FIG. 3) | $I_o = 1 + \tau^2 S^2$ | Active Compensation |

TABLE 1-continued

| Active Filter | Approximate value of $I_o$ | Comments |
|---|---|---|
|  | $I_o = 1 + \tau^3 S^3$ | A + P Compensation |
| No. 12'''(FIG. 4) | $I_o = 1 + \tau^2 S^2$ | Active Compensation |
|  | $I_o = 1 + \tau^3 S^3$ | A + P Compensation |

The value of $I_i$ in the equation (1) will be exactly equal to 1, $I_i = 1$, when:

$$\frac{G_a}{G_t} = \frac{G_a'}{G_t'} \quad (4)$$

and $$C_a/G_a = (C_a + C_c)/G_t$$

In effect, the values $I_o$ and $I_i$ approaches the ideal value of 1 when $|\tau S|$ tends towards zero.

By incorporating the passive section 11, the transfer functions $v_o/v_i$ and $e/v_i$ can be written:

$$\frac{v_o}{v_i} = \frac{\mu(D_i - \rho_a D_2 I_i)}{D_2 I_o - \mu N} \quad (5)$$

$$\frac{e}{v_i} = \frac{D_i I_o - \mu \rho_a N I_i}{D_2 I_o - \mu N}$$

where $$D_i = \frac{C_{21}}{C_2} s^2 + \frac{G_{21}(C_1 + C_2)}{C_1 C_2} s + \frac{G_{21} G_1}{C_1 C_2} \quad (6)$$

$N = G_1 s / C_2$ $$D_2 = s^2 + \left[ \frac{G_2(C_1 + C_2)}{C_1 C_2} + \frac{G_1}{C_2} \right] s + \frac{G_1 G_2}{C_1 C_2}$$

$C_2 = C_{21} + C_{22}$
$G_2 = G_{21} + G_{22}$ $G_{21}$, $G_{22}$ are the conductances of 16' and 16'' respectively.

When $I_o$ and $I_i$ become 1, the equations 5 and 6 can be written:

$$\frac{v_o}{v_i} = \mu \left\{ (\tau_c - \rho_a) s^2 + \left[ (\tau_G - \rho_a) \frac{G_2(C_1 + C_2)}{C_1 C_2} - \rho_a \frac{G_1}{C_2} \right] s + (\tau_G - \rho_a) w_o^2 \right\} / D_1 \quad (7)$$

$$\frac{e}{v_i} = \left\{ \tau_c s^2 + \left[ \tau_G \frac{G_2(C_1 + C_2)}{C_1 C_2} - \mu \rho_a \frac{G_1}{C_2} \right] s + \tau_G w_o^2 \right\} / D_1 \quad (8)$$

where we define:

$$\tau_c = \frac{C_{21}}{C_2}, \tau_G = \frac{G_{21}}{G_2}, w_o^2 = \frac{G_1 G_2}{C_1 C_2} \quad (9)$$

$$D_1 = s^2 + \left[ \frac{(G_2(C_1 + C_2)}{C_1 C_2} - (\mu - 1) \frac{G_1}{C_2} \right] s + w_o^2$$

The equations 7, 8 and 9 permit to realize the biquadratic function. By examining the equations 7 and 8 closely, we can see that the outputs e realize more easily the two transfer functions of bandpass and lowpass.

For a hybrid integration, it is often desirable that the capacitors 18', 18'' and 18''' be fixed in advance. Thus, the buffer 15 is provided which gives another degree of flexibility, of the gain, to realize a desired transfer function. A relationship of $\tau_c = C_{21}/C_2$ equals to 0 or 0.5 covers a large group of functions. We note that the gain of the buffer circuit 15 must be $\geq 1$ when the output e is utilized.

It is within the ambit of the present invention to cover any obvious modifications thereof provided these fall within the definition of the appended claims.

I claim:

1. A positive feedback RC active biquadratic filter circuit comprising a passive input RC section, and an active amplification output section having at least one operational amplifier, said RC section having two true resistive T-networks and a true capacitive T-network connected to receive an input signal, said RC section realizing a second order function with a low Q factor, said operational amplifier having a feedback resistive connection from an output thereof to a mid-junction point between each of three capacitances in said capacitive T-network, said capacitive T-network and one of said two resistive T-networks being connected to a positive input of said operational amplifier, said other resistive T-network being connected to a negative input of said operational amplifier.

2. A filter circuit as claimed in claim 1 wherein said active amplification section comprises two operational amplifiers, a second of said operational amplifiers being connected in a feedback mode to provide high frequency compensation and thermal compensation in said active amplification section, said second operational amplifier having a positive input connected to said output of said at least one operational amplifier, a further true T-resistive network connected to said positive input of said second operational amplifier, said further true T-resistive network also connected to receive said input signal, said second operational amplifier having an output connected to said negative input of said at least one operational amplifier, and a further true T-capacitive network connected to a negative input of said second operational amplifier and also connected to receive said input signal.

3. A filter circuit as claimed in claim 2 wherein said further T-capacitive network and said other resistive T-network are connected in parallel, said other resistive T-network having resistance values identical to the resistance values of said further T-resistive network.

4. A filter circuit as claimed in claim 2 wherein a buffer circuit is connected to said positive input of said at least one operational amplifier whereby said circuit operates as a band-pass filter stage.

5. A filter circuit as claimed in claim 2 wherein a buffer circuit is connected to said output of said at least one operational amplifier whereby said circuit operates as a high pass, band stop or low pass notch or high pass notch filter stage.

6. A filter circuit as claimed in claim 4 or 5 where said buffer circuit comprises two operational amplifiers connected in a feedback mode, an output of a first of said amplifiers being connected to a positive input of a second of said amplifiers, an output of said second amplifier being connected to a negative input of said first amplifier, said first amplifier having an input connection to receive a signal from said inputs of said at least one operational amplifier, said second amplifier having a positive input connection and an output connection to receive a signal from said output of said at least one operational amplifier.

7. A filter circuit as claimed in claim 6 wherein said second amplifier provides for high frequency and thermal compensation, said second amplifier having said output thereof connected to a capacitive network to provide for said high frequency compensation.

8. A filter circuit as claimed in claim 7 wherein said positive input of said first amplifier has a resistive voltage divider network, and a feedback resistor at said output of said first and second amplifiers.

9. A filter circuit as claimed in claim 2 wherein said active amplification section has a function mathematically expressed as $I_o = 1 + \tau^2 S^2$ for active compensation, and $I_o = 1 + \tau^3 S^3$ for active and passive compensation, where $I_o$ is the performance index; $\tau$ is the resistive ratio and S is the Laplace operator.

10. A filter circuit as claimed in claim 1 wherein said active amplification section comprises two operational amplifiers, a second of said operational amplifiers being connected in a feedback mode to provide high frequency and thermal compensation in said active amplification section, said second operational amplifier having a positive input connected to said output of said at least one operational amplifier, a capacitor connected between ground and a negative input of said second operational amplifier to realize said high frequency compensation, and an output of said second operational amplifier being connected to a negative input of said at least one operational amplifier.

11. A filter circuit as claimed in claim 10 wherein a further capacitor is connected across said negative and positive inputs of said second operational amplifier to obtain high frequency compensation in combination with said capacitor connected between said negative input and ground.

12. A filter circuit as claimed in claim 11 wherein a first feedback resistance is connected across said further capacitor, a second resistance connected between said negative input and said output of said second operational amplifier, a third resistance connected between said output of said second operational amplifier and said negative input of said at least one operational amplifier; said first, second, and third resistances providing for the gain of said active amplification section and feedback impedances.

13. A filter circuit as claimed in claim 11 wherein said active amplification section has a function mathematically expressed as $I_o = 1 + \tau^2 S^2$ for active compensation, and $I_o = 1 + \tau^3 S^3$ for active and passive compensation, where $I_o$ is the performance index; $\tau$ is the resistive ratio and S is the Laplace operator.

14. A filter circuit as claimed in claim 10, wherein a first resistance is connected between said output of said at least one operational amplifier and said positive input of said second operational amplifier, a second resistance connected from said positive input to ground, a third resistance connected across said capacitor, and a fourth resistance connected from said output of said second operational amplifier respectively to said negative input of said at least one and second operational amplifiers.

15. A filter circuit as claimed in claim 10 wherein a buffer circuit is connected to said positive input of said at least one operational amplifier.

16. A filter circuit as claimed in claim 10 wherein said active amplification section has a function mathematically expressed as $I_o = 1 + \tau^2 S^2$ for active compensation, and $I_o = 1 + \tau^3 S^3$ for active and passive compensation, where $I_o$ is the performance index; $\tau$ is the resistive ratio and S is the Laplace operator.

17. A filter circuit as claimed in claim 10 wherein a buffer circuit is connected to said negative input of said at least one operational amplifier.

18. A filter circuit as claimed in claim 10 wherein a buffer circuit is connected to said output of said at least one operational amplifier.

19. A filter circuit as claimed in claim 15, 17 or 18, wherein said buffer circuit comprises two operational amplifiers connected in a feedback mode, an output of a first of said amplifiers being connected to a positive input of a second of said amplifiers, an output of said second amplifier being connected to a negative input of said first amplifier, said first amplifier having an input connection to receive a signal from said inputs of said at least one operational amplifier, said second amplifier having a positive input connection and an output connection to receive a signal from said output of said at least one operational amplifier.

20. A filter circuit as claimed in claim 1 wherein said active amplification section has a function mathematically expressed as $I_o = 1 + \tau S$ for no compensation, and $I_o = 1 + \tau^2 S^2$ for passive compensation, where $I_o$ is the performance index; $\tau$ is the resistive ratio and S is the Laplace operator.

21. A filter circuit as claimed in claim 1 or 2 wherein a buffer circuit is connected to said negative input of said at least one operational amplifier whereby said circuit operates as a low pass filter stage.

22. A positive feedback RC filter circuit comprising a passive input RC section, and an active amplification output section having at least one operational amplifier, said RC section having two true resistive T-networks and a true capacitive T-network and a single resistive feedback connection to realize a true second order function.

* * * * *